(12) United States Patent
Schirmer et al.

(10) Patent No.: US 7,196,404 B2
(45) Date of Patent: Mar. 27, 2007

(54) MOTION DETECTOR AND METHOD OF PRODUCING THE SAME

(75) Inventors: Mark L. Schirmer, Stoughton, MA (US); Thomas W. Kelly, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 219 days.

(21) Appl. No.: 10/849,578

(22) Filed: May 20, 2004

(65) Prior Publication Data

US 2005/0260788 A1 Nov. 24, 2005

(51) Int. Cl.
*H01L 23/495* (2006.01)
*G01P 9/04* (2006.01)
*G01P 15/00* (2006.01)

(52) U.S. Cl. ............... 257/676; 257/666; 257/E23.039; 257/E23.031; 73/504.12; 73/514.01

(58) Field of Classification Search ................ 257/666, 257/676, E23.039, E23.031; 73/504.12, 73/504.03, 504.09, 514.01
See application file for complete search history.

(56) References Cited

U.S. PATENT DOCUMENTS

| | | | |
|---|---|---|---|
| 5,939,633 A | 8/1999 | Judy | 73/514.32 |
| 6,505,511 B1 | 1/2003 | Geen et al. | 73/504.12 |
| 2004/0163470 A1* | 8/2004 | Babala et al. | 73/514.01 |

* cited by examiner

*Primary Examiner*—Luan Thai
(74) *Attorney, Agent, or Firm*—Bromberg & Sunstein LLP (57) ABSTRACT

A method of producing an electronic device electrically and mechanically couples an integrated circuit to a leadframe to produce an intermediate assembly. At least a portion of the intermediate assembly then is encapsulated with a molten encapsulating material. After it is encapsulated, the method permits the molten encapsulating material to substantially solidify. A method of detecting the orientation of a sensor as mounted to an external object also is disclosed.

8 Claims, 9 Drawing Sheets

MOTION DETECTOR AND METHOD OF PRODUCING THE SAME

RELATED APPLICATIONS

This patent application is related to co-pending U.S. patent application Ser. No. 10/849,605, filed on even date herewith, entitled, "INTEGRATED FASTENER AND MOTION DETECTOR," and naming Mark L. Schirmer and Thomas W. Kelly as inventors, the disclosure of which is incorporated herein, in its entirety, by reference.

FIELD OF THE INVENTION

The invention generally relates to electronic devices and, more particularly, the invention relates to electronic devices, such as motion detecting devices, and methods of producing the same.

BACKGROUND OF THE INVENTION

A variety of different applications use motion sensors to detect the motion of an underlying object. One widely used application involves detecting the motion of an automobile. Specifically, motion sensors often are mounted about the periphery of an automobile chassis to sense pre-specified accelerations or rotations. Those in the art typically refer to such sensors as "satellite sensors."

When a satellite sensor detects a pre-specified type of motion, systems within the automobile respond in an pre-specified manner. For example, if a satellite sensor detects a sudden and high deceleration, air-bag systems may deploy their air bags. Alternatively, if a satellite sensor detects a sudden rotation (e.g., the automobile is swerving), breaking systems may selectively break to avoid a rollover. Accordingly, satellite sensors have become critical in ensuring automobile safety.

Currently available satellite sensors typically have a relatively large housing that contains both a printed circuit board with electronics for detecting motion, and a mounting device (e.g., bushings) for mounting the housing to the automobile. Moreover, to facilitate mounting, the housing generally is molded to a shape that conforms to the specific geometry of the portion of the chassis to which it is to be mounted. Use of such a satellite sensor, however, is undesirable for a number of reasons. Among other things, its use of a printed circuit board with a relatively high number of electronic components necessitates the relatively large housing. This runs counter to the trend toward miniaturizing electronics.

In addition, although desirable in some instances, many currently available satellite sensors can be mounted to their underlying automobile chassis in only one orientation. For example, a satellite sensor may have two substantially parallel spaced bushings for receiving screws that couple with corresponding holes in the automobile chassis. The sense axis of such a satellite sensor thus can be oriented relative to no more than one axis of the automobile. Accordingly, the bushings must be positioned in a pre-specified location of the housing so that, when mounted to the chassis, the sense axis is aligned with the appropriate axis of the automobile. If not, then another satellite sensor with a different bushing configuration must be used. In other words, if a first satellite sensor is not configured to orient its sense axis along a desired axis, then another satellite sensor with bushings that orient the sense axis in a different direction (i.e., the direction of interest) must be used.

SUMMARY OF THE INVENTION

In accordance with one aspect of the invention, a method of producing an electronic device electrically and mechanically couples an integrated circuit to a leadframe to produce an intermediate assembly. At least a portion of the intermediate assembly then is encapsulated with a molten encapsulating material. After it is encapsulated, the method permits the molten encapsulating material to substantially solidify.

In some embodiments, a portion of the lead frame remains exposed after the intermediate assembly is encapsulated. In fact, even in that case (or in other cases), the entire intermediate assembly may be encapsulated. Among other ways, the intermediate assembly may be encapsulated by insert molding it within a molding machine.

The integrated circuit, which may include at least one of an accelerometer or a gyroscope, may include a package that is mechanically coupled to the leadframe. For example, the package may be surfaced mounted to the leadframe. The integrated circuit also may have a substantially planar interface side that is mounted to be substantially flush against the leadframe. Of course, not all embodiments are limited to gyroscopes or accelerometers. Other types of integrated circuits can implement various embodiments of the invention. Alternative embodiments of the integrated circuit include capped die, where the die is mechanically coupled with the leadframe In accordance with another aspect of the invention, an apparatus has a leadframe, an integrated circuit coupled to the leadframe, and an encapsulating material on at least a part of both the leadframe and the integrated circuit.

The integrated circuit, which may include a sensor packaged at the die level (e.g., a capped die, which may have a hermetic cavity surrounding sensing structure via wafer to wafer bonding), also may include a package that is directly mounted to the leadframe. Among other implementations, the integrated circuit may be a MEMS device and/or include an accelerometer or gyroscope. The apparatus further may have an interface port capable of coupling with an external device. In such case, the interface port may be electrically connected to the leadframe. The integrated circuit illustratively includes an interface side that is flush mounted against the leadframe, and preferably is electrically connected to the leadframe without a wire bond.

In accordance with another aspect of the invention, a motion detector capable of sensing motion of an external object (e.g., where the external object is connected to or integrated with the motion detector) along or about at least one of first and second axes is mountable in a plurality of orientations. To that end, the motion detector has a sensor mount and a motion sensor coupled with the sensor mount. The sensor mount has a first coupler capable of mounting the sensor mount to the external object in a first orientation (i.e., orienting the sensor to sense motion about or along the first axis). The sensor mount also has a second coupler that is capable of mounting the sensor mount to the external object in a second orientation (i.e., orienting the sensor to sense motion about or along the second axis).

The first coupler may include a conductive tube for receiving a fastener, and/or may be substantially orthogonal to the second coupler. Among other types, the sensor may be capable of detecting motion along or about one axis only. In other embodiments, the sensor is a multi-degree of freedom sensor (e.g., two or three aces of sensitivity). Moreover, the sensor may be a MEMS device implementing an accelerometer or a gyroscope, and may include circuitry for detecting the orientation of the sensor mount.

The motion detector illustratively is capable of being alternatively coupled in one of the first or second orientations to respectively detect motion along or about one of the first and second axes. The sensor mount, however, also may mount in a third orientation. To that end, the sensor has a third coupler that is capable of mounting the sensor mount to the external object in the noted third orientation (i.e., orienting the sensor to sense motion along or about a third axis). Such a motion detector thus is capable of being alternatively coupled in one of the first, second, and third orientations to respectively detect motion along or about one of the first, second, and third axes.

In accordance with yet another aspect of the invention, a sensor mount for mounting a motion sensor (capable of detecting motion along or about a sensor axis) to an external object may be aligned with either of a plurality of axes. To that end, the sensor mount has a mounting area for mounting the sensor, and a coupler system that is capable of coupling to the external object in a manner that aligns the sensor axis with either one of first and second axes. The motion sensor is capable of detecting motion of the external object along or about the axis to which the sensor axis is aligned.

In accordance with still another aspect of the invention, a leadframe is capable of receiving a motion sensor (having a sense axis) in a plurality of different orientations. To that end, the leadframe includes at least one mounting location having a plurality of contacts positioned to be capable of receiving the motion sensor in either a first orientation or a second orientation. The contacts are capable of electrically communicating with the motion sensor. The first orientation aligns the sense axis (of the sensor) with a first axis, while the second orientation aligns the sense axis with a second axis.

In some embodiments, the first axis is substantially orthogonal to the second axis. Moreover, the at least one mounting surface may include a first and second substantially orthogonal surfaces. The plurality of contacts may be on a single mounting surface, or distributed across multiple surfaces.

The contacts may be positioned to permit more than two orientations. For example, the plurality of contacts may be positioned to be capable of receiving the motion sensor in either one of the first orientation, the second orientation, or a third orientation. The third orientation aligns the sense axis with a third axis. The first, second, and third axes all may be substantially orthogonal to each other.

In accordance with another aspect of the invention, a motion detector has a motion sensor capable of detecting motion along or about a sense axis, and a leadframe having at least one mounting location. The at least one mounting location has a plurality of contacts positioned to be capable of receiving the motion sensor in either a first orientation or a second orientation. The contacts are capable of electrically communicating with the motion sensor. The motion sensor is coupled with at least one of the plurality of contacts in either the first orientation or the second orientation. The first orientation aligns the sense axis with a first axis, while the second orientation aligns the sense axis with a second axis.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In illustrative embodiments, a satellite sensor has a significantly reduced profile and thus, can be more flexibly mounted to an automobile chassis. To those ends, the satellite sensor has an inertial sensor (e.g., a MEMS accelerometer or gyroscope) that can be coupled directly to a corresponding leadframe. No circuit board is necessary due to the integrated structure of the sensor.

In other embodiments, a satellite sensor can mount to a single automobile mounting apparatus (e.g., a bolt hole in the chassis) in two or more different orientations. Each of the two or more different orientations orients the sense axis of the sensor in a different direction. Consequently, although a satellite sensor implementing this embodiment may have a single one-dimensional inertial sensor, it still has the flexibility to sense motion in any one of a plurality of different directions (when accessible to only a single mounting apparatus). Various embodiments thus have a mounting system that permits the satellite sensor to be oriented in one of two or more different directions.

For example, a given satellite sensor may have first and second orthogonal bushings with integrated bolts. If the bolt through the first bushing mounts to a given mounting hole in the chassis, then the sensor is oriented in a first direction (e.g., along the longitudinal axis of an automobile). Conversely, if the bolt through the second bushing mounts to the same mounting hole, then the sensor is oriented in a different, orthogonal direction (e.g., orthogonal to the longitudinal axis of the same automobile). Accordingly, the given satellite sensor has the flexibility to be oriented along or about either one of two orthogonal axes.

In yet other embodiments of the invention, a leadframe is configured to receive an inertial sensor in two or more different orientations. Accordingly, the leadframe and a single one-dimensional inertial sensor can be combined in two or more different ways to ultimately sense motion along one of two or more different axes (when mounted to a chassis). Details of this and other embodiments of the invention are discussed below.

Figure 1:
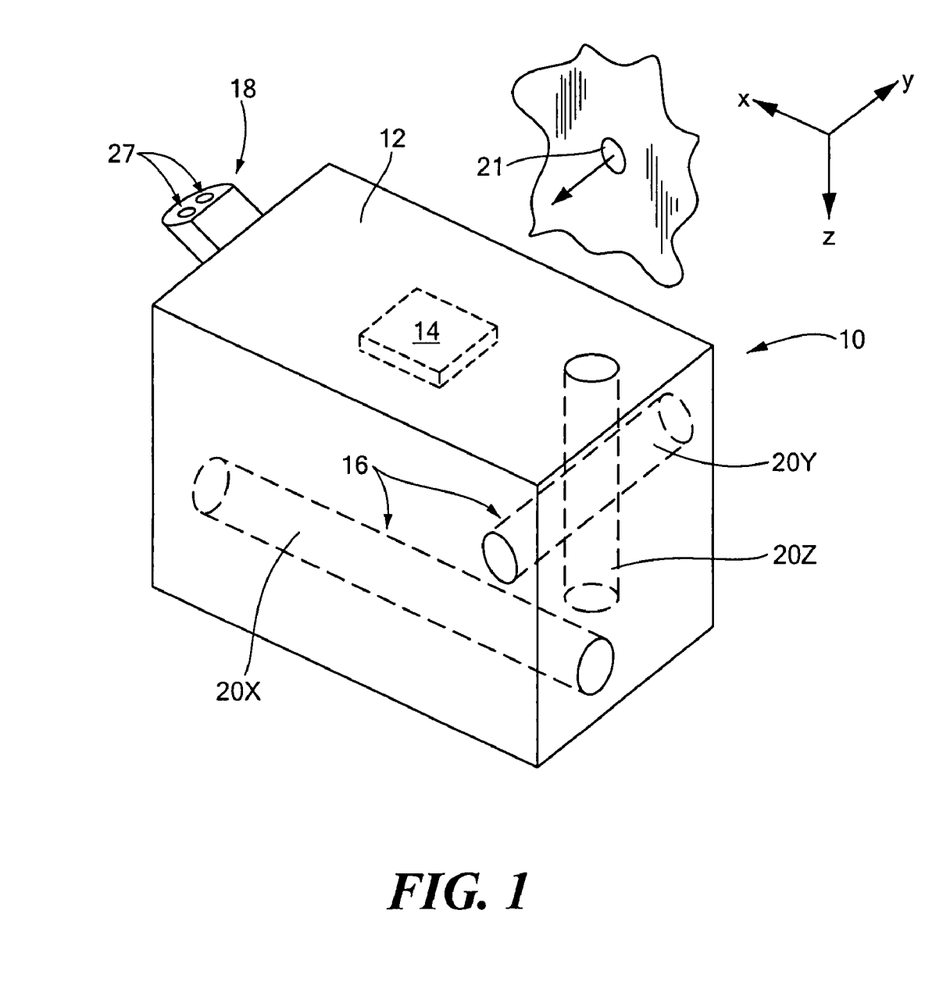
FIG. 1 schematically shows a satellite sensor configured in accordance with illustrative embodiments of the invention.

FIG. 1 schematically shows a simplified view of a satellite sensor 10 configured in accordance with illustrative embodiments of the invention. Note that in a manner similar to other drawings referred to herein, FIG. 1 is not necessarily drawn to scale. The satellite sensor 10 has an body 12 (e.g., injection molded or capable of receiving a press-fit device) containing an inertial sensor 14 (e.g., a MEMS gyroscope or accelerometer, shown in phantom and identified by reference number 14) and a mounting system 16 for mounting the sensor to a mounting apparatus in an underlying structure (e.g., an automobile chassis). The satellite sensor 10 also has an interface port 18 for communicating with external electronic devices (e.g., a computer system). The interface port 18 has both the mechanical coupling structure for coupling with a wiring harness, and one or more leads 27 to electrically communicate with an external electronic device.

In illustrative embodiments, the mounting system 16 includes an X-axis bushing 20X, a Y-axis bushing 20Y, and a Z-axis bushing 20Z. The bushings 20X, 20Y and 20Z may be other coupling or electrical contacting devices. Accordingly, discussion of the bushings 20X, 20Y, and 20Z is illustrative and not necessarily intended to limit all embodiments.

The mounting system 16 also may include a registration pin (not shown) to fix the orientation of the module so it cannot rotate about any of the mounting bushings 20X, 20Y, or 20Z. It should be noted that the designation of any of the bushings as an "N-axis" bushing simply means that its longitudinal axis is substantially parallel with the N-axis defined by FIG. 1. It does not mean that using such a bushing necessarily will align the sensitivity axis of the satellite sensor 10 with the N-axis (although it might, in certain cases). For example, the longitudinal axis of the X-axis bushing 20X is substantially parallel with the X-axis. It does not necessarily follow, however, that use of the X-axis bushing 20X always aligns the sense axis with the X-axis. The discussion below should make this more apparent.

A technician can mount the satellite sensor 10 by securing a bolt to a chassis mounting hole 21 (shown schematically in FIG. 1 and oriented to have a longitudinal axis that is substantially parallel with the Y-axis) through the appropriate bushing 20X, 20Y, or 20Z. Selection of the appropriate bushing 20X, 20Y, or 20Z is a function of a number of factors, such as the orientation of the sense axis of the inertial sensor 14, the orientation of the mounting hole 21 and, of course, the desired axis of sensitivity of the overall satellite sensor 10.

Accordingly, if the sense axis of the inertial sensor 14 in FIG. 1 is along the X-axis and the desired axis of sensitivity is along the X-axis, then a bolt should be secured to the mounting hole 21 through the Y-axis bushing 20Y. If the sense axis of the inertial sensor 14 is along the Y-axis, however, then the bolt should be secured to the mounting hole 21 through the X-axis bushing 20X to maintain the same axis of sensitivity. As a further example, if the sense axis of the inertial sensor 14 is along the X-axis, but the desired axis of sensitivity is along the Y-axis, then the X-axis bushing 20X should be used.

Those skilled in the art should understand that devices with the functionality of the disclosed satellite sensors may be coupled with a wide variety of external objects, such as airplanes, hand-held video games, and missiles. Accordingly, discussion of its use with automobiles is exemplary and thus, not intended to limit various embodiments of the invention.

Figure 2:
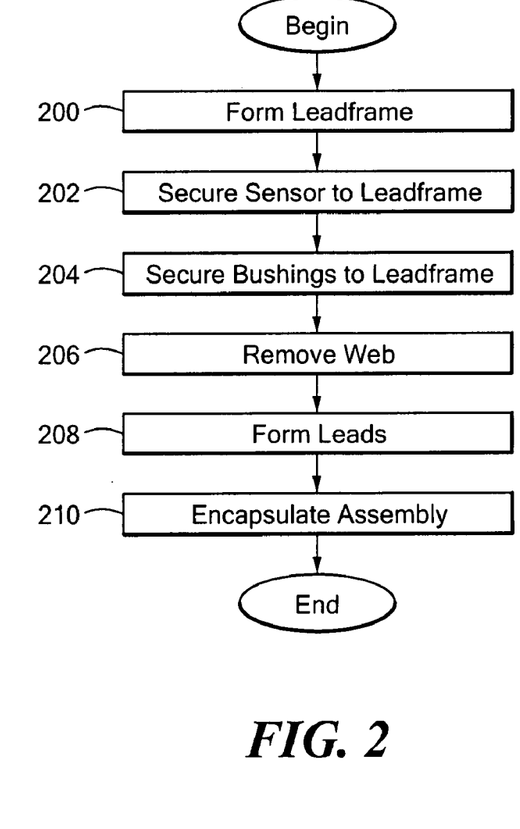
FIG. 2 shows an illustrative process for producing the satellite sensor shown in FIG. 1.
Figure 3:
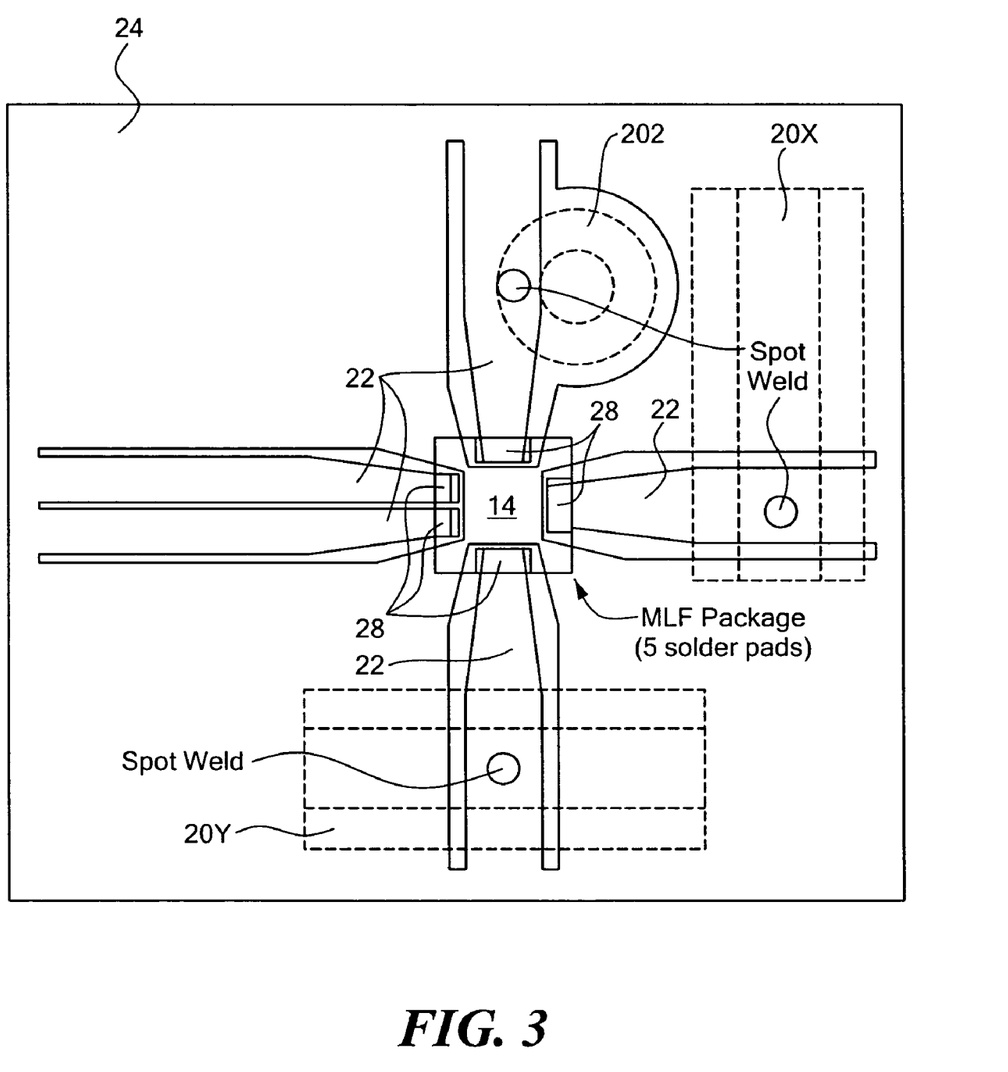
FIG. 3 schematically shows a leadframe (before its web is removed) and components (in phantom) to be secured to the leadframe.

FIG. 2 shows an illustrative process of producing the satellite sensor 10 shown in FIG. 1. The process begins at step 200, in which a leadframe 22 is formed in accordance with conventional processes. For example, the leadframe 22 may be stamped from a flat sheet of a metal 24 (e.g., copper or aluminum) to a shape that is consistent with the goals of illustrative embodiments. FIG. 3 schematically shows an exemplary sheet of metal 24 from which the discussed leadframe 22 ultimately will be formed. As shown, the sheet of metal 24 has been stamped to form five branches that ultimately make up the leadframe 22. Additionally, the stamping process illustratively forms a pre-specified land pattern for receiving an inertial sensor 14.

The process then continues to step 202, in which the inertial sensor 14 is secured to the leadframe 22 as shown in FIG. 3. To that end, conventional processes both electrically and mechanically connect a plurality of metallic contacts 28 on the inertial sensor 14 (see FIGS. 4A–4D, discussed below) to the leadframe 22—no wire bonds are necessary, although they could be used in some embodiments. One embodiment uses reflow solder process (i.e., IR reflow) to make that connection. Prior to soldering, however, the inertial sensor 14 may be tacked into position with a low tack adhesive. After soldering, the inertial component may be over-coated or potted for environmental protection.

If high temperature processes (e.g., soldering) are used to secure the inertial sensor 14 to the leadframe 22, then components of the inertial sensor 14 should be able to withstand the temperatures generated during such a process (e.g., between 245 and 265 degrees C.). If not, then lower temperature processes can be used. For example, a conductive adhesive can make the connection. Alternatively, localized laser reflow soldering can be used.

As noted above, the inertial sensor 14 may be a MEMS device implemented as an accelerometer or gyroscope. Of course, other embodiments may be used with other types of devices, such as MEMS pressure sensors. In fact, some embodiments may be used with non-MEMS devices or general integrated circuits. Accordingly, discussion of inertial sensors, such as MEMS accelerometers and gyroscopes, is exemplary and not intended to limit the scope of various embodiments. Moreover, the inertial sensor 14 may include one or more die and/or passive components.

Figure 4A:
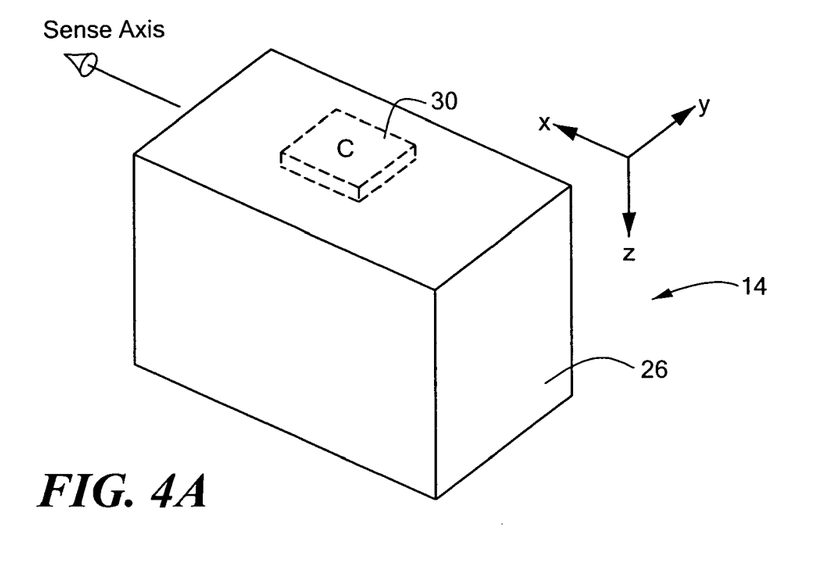
FIG. 4A schematically shows a perspective view of a MEMS sensor that may be a part of the satellite sensor in FIG. 1.

FIG. 4A schematically shows an inertial sensor 14 that may be used in the satellite sensors discussed herein. Again, in a manner similar to the satellite sensor 10 of FIG. 1, the inertial sensor 14 shown in FIG. 4A is not necessarily drawn to scale. The inertial sensor 14 may be any such sensor in the art. For example, the inertial sensor 14 may have a conventional package 26 that contains one or more die (not shown) having structure and circuitry for implementing the underlying function. A capped inertial sensor 14 also may be considered to be packaged (i.e., a packaged integrated circuit).

When implemented as an accelerometer, the inertial sensor 14 may have a mass suspended above a die, and circuitry for detecting mass movement. The die also may have standard transmit circuitry for forwarding information relating to detected mass movement to an external device via the interface port 18. Alternatively, the logic may be distributed across multiple die. Illustrative embodiments integrate the accelerometer functionality (structure and circuitry) on a single die. Exemplary MEMS accelerometers include those distributed and patented by Analog Devices, Inc. of Norwood, Mass. Among others, see U.S. Pat. No. 5,939,633, the disclosure of which is incorporated herein, in its entirety, by reference.

When implemented as a gyroscope, the inertial sensor 14 may have an oscillating mass suspended above a die, and circuitry for actuating and detecting mass movement. In a manner similar to the above noted accelerometers, the die also may have standard transmit circuitry for forwarding information relating to certain mass movement to an external device via the interface port 18. Illustrative embodiments integrate the gyroscope functionality (structure and circuitry) on a single die. Exemplary MEMS gyroscopes include those distributed and patented by Analog Devices, Inc. of Norwood, Mass. Among others, see U.S. Pat. No. 6,505,511, the disclosure of which is incorporated herein, in its entirety, by reference.

In the position shown in FIG. 4A, the inertial sensor 14 has a sense axis that is substantially parallel with the X-axis. If the inertial sensor 14 is an accelerometer, the inertial sensor 14 thus senses motion along the X-axis. In a similar manner, if the inertial sensor 14 is a gyroscope, the inertial sensor 14 shown in FIG. 4A senses motion about the X-axis (i.e., rotation about the X-axis). Of course, those in the art understand that the inertial sensor 14 can have multiple sense axes. Nevertheless, only one sense axis is discussed herein for simplicity.

Figure 4B:
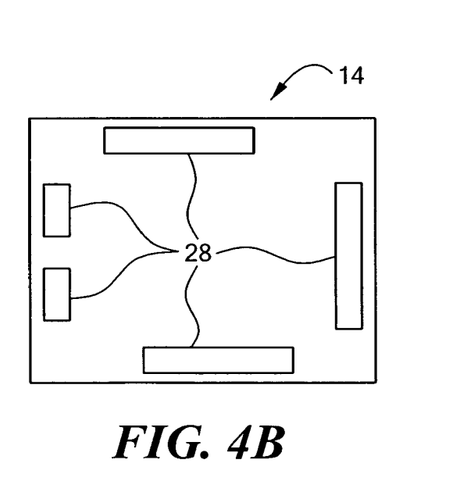
FIG. 4B schematically shows a bottom view of the MEMS sensor shown in FIG. 4A.

FIG. 4B schematically shows a bottom view of the inertial sensor 14, which clearly shows the contact pattern on the sensor bottom face. The pattern shown has five metallic contacts 28. Two of the contacts 28 may transmit and receive information relating to the basic inertial sensing function of the inertial sensor 14. The remaining three contacts 28 may deliver bolt down detect signals to the bolts and bushings 20X, 20Y, and 20Z. Details of the bolt down detect signals are discussed below.

Figure 4C:
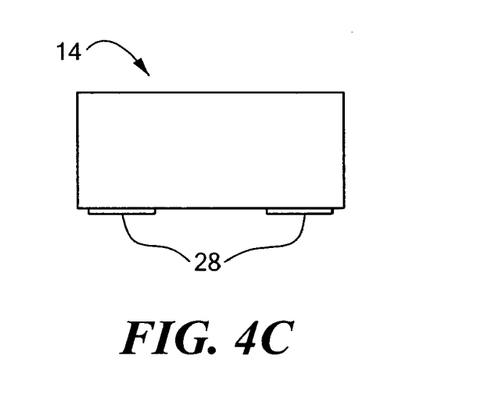
FIG. 4C schematically shows a side view of the MEMS sensor shown in FIG. 4A.

As shown in FIG. 3, each sensor contact 28 is mounted to one part of the leadframe 22. Accordingly, the land pattern of the leadframe 22 (noted above as being formed by the stamping process) preferably is configured to match that of the contact pattern on the bottom face of the inertial sensor 14. Moreover, the contacts 28 illustratively are substantially coplanar or extend slightly from the bottom face. FIG. 4C exemplifies this relationship. Substantially flat contacts 28 produced in this manner should facilitate processes that couple the contacts 28 to the leadframe 22. Accordingly, conventional surface mounting techniques may be used to mount the bottom face in a substantially flush manner against the leadframe 22.

To facilitate soldering, the contacts 28 on the bottom face of the inertial sensor 14 may have solder pads or solder bump connections. Depending on the finish of the contact pattern, these alternative components may eliminate the need for solder paste to be dispensed or screened onto the package 26 prior to attaching the inertial sensor 14.

Figure 4D:
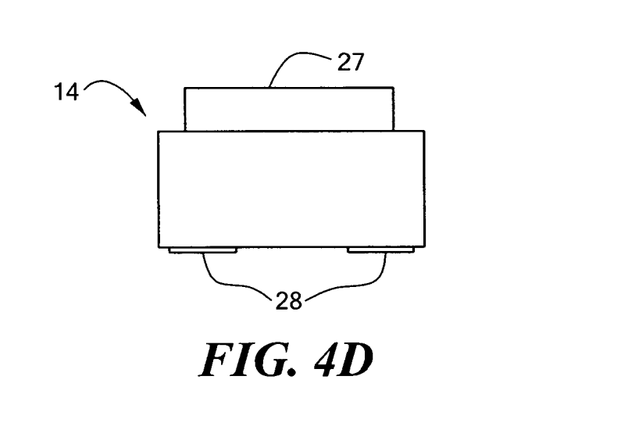
FIG. 4D schematically shows a side view of another MEMS sensor (having a cap on a die) that may be used in the satellite sensor shown in FIG. 1.

Inertial sensors having different types of packages 26 can be used. In fact, rather than use a package 26, the inertial sensor 14 can have a cap 27 that seals the die on which the functionality is formed. The seal illustratively may be a particle shield or hermetic. As an example, FIG. 4D schematically shows a capped integrated circuit with a hermetic seal.

Returning to the flow chart of FIG. 2, after the sensor is secured to the leadframe 22 in step 202, the process continues to step 204, in which the bushings 20X, 20Y, and 20Z are secured to the leadframe 22. To that end, as shown in FIG. 3, conventional spot welding processes secure the three bushings 20X, 20Y, and 20Z to the leadframe 22. One of the bushings 20Z shown in FIG. 3 is spot welded at its top surface, while the other two 20X and 20Y are spot welded along their outer surfaces. As shown, each bushing 20X, 20Y, and 20Z illustratively is spot welded to one of the branches of the leadframe 22 to provide a conductive path for the bolt down protection circuitry.

More specifically, as noted above, the satellite sensor 10 has logic for determining if it is bolted to an automobile chassis. To that end, when a metallic bolt is secured to a metallic automobile chassis through any one of the bushings 20X, 20Y, and 20Z, it forms an electrical contact between the one bushing 20X, 20Y, or 20Z and the automobile chassis. Such contact closes a ground connect circuit between the inertial sensor 14 and the bushing 20X, 20Y, or 20Z, thus permitting a limited current to flow toward ground. This circuit extends from 1) the logic on the die, 2) to the leadframe 22, 3) to the bushing 20X, 20Y, or 20Z, 4) to the bolt, and then 5) to the chassis. Accordingly, the bushings 20X, 20Y, and 20Z illustratively are produced from a conductive metallic material, such as brass, to conduct this current.

Upon detection of this current circuitry 30 (shown schematically and in phantom in FIG. 4A) can transmit a "connect signal" to an external computer indicating that the satellite sensor 10 is secured to the chassis. If no such signal is transmitted, the computer can light a warning light in the dash of the automobile. Moreover, the logic on the inertial sensor 14 can detect which bushing 20X, 20Y, or 20Z is being used by determining which branch of the leadframe 22 is conducting the current. Accordingly, the logic also can identify the orientation of the satellite sensor 10.

Conventional circuitry in the inertial sensor 14 both generates and senses this current. Such circuitry simply can be three resistors (not shown) that each are serially coupled between a voltage source and one of the bushings 20X, 20Y, or 20Z. When circuitry detects a voltage across one of the resistors, it may generate a signal (i.e., the above noted connect signal) indicating that the satellite sensor 10 is coupled with the chassis.

Moreover, the resistor across which the voltage is detected also identifies which bushing 20X, 20Y, or 20Z is in use. For example, if the circuitry detects voltage across the resistor coupled with the X-axis bushing 20X (and the inertial sensor 14 has a sense axis that is substantially parallel with the X-axis), then the sensor of FIG. 1 is oriented in the Y-direction. Consequently, the circuitry can transmit a signal to the computer indicating that the satellite sensor 10 is oriented in the Y-direction. The computer then may check to confirm that the satellite sensor 10 is properly oriented. If not, the computer may light another warning light in the dash of the automobile.

There may be instances, however, when the mounting apparatus and/or external object to which the satellite sensor 10 is connected is not conductive. For example, the mounting apparatus may be an insulator, such as a hard plastic. In such case, the noted bolt down detect circuitry discussed above would not operate. Accordingly, in alternative embodiments, the bushings 20X, 20Y, and 20Z are split longitudinally or laterally into two or more spaced portions, where one of the two portions is electrically connected to ground. The bolt down detection logic thus can accomplish the same function when a bolt (through a given bushing 20X, 20Y, or 20Z) completes the circuit between the different portions of the bushing 20X, 20Y, or 20Z. This alternative thus eliminates the requirement that the bolt have an electrical communication with the chassis.

In some embodiments, the satellite sensor 10 has only two bushings 20. In yet other embodiments, the bushings 20X, 20Y, and 20Z are not substantially orthogonal. The relative orientation of the bushings 20X, 20Y, and 20Z thus may be a function of the mounting apparatus in the external object to which they are to be mounted. Some embodiments have substantially parallel bushings 20X, 20Y, and 20Z. In such a case, the bushings 20X, 20Y, and 20Z each may be used for different mounting orientations. For example, to mount relative to the X-axis, a first bushing 20X may be used, while a second bushing 20Y may be used to mount relative to the Y-axis. Sensing logic can determine which bushing 20X or 20Y is in use and forward necessary information as required.

Figure 5:
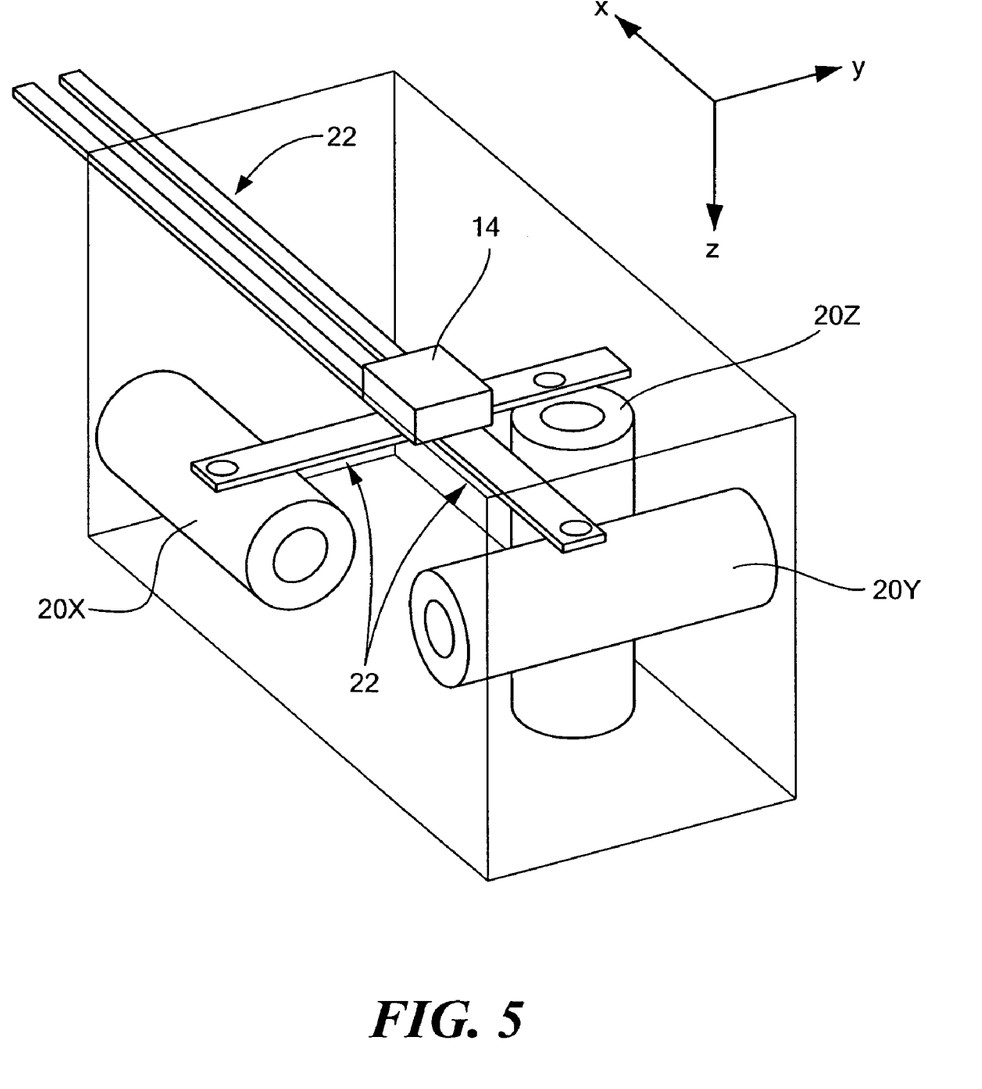
FIG. 5 schematically shows a perspective view of a leadframe with mounted bushings and sensors before being at least partially encapsulated.

Returning again to the process of FIG. 2, the process continues to step 206, in which unneeded portions of the sheet of metal 24 (from which the leadframe 22 ultimately is formed) are removed. These portions, which often are referred to as the "web," may be removed by conventional stamping or other processes that cut away the unnecessary portions. After the web is removed, the five branches remain and, as noted above, are secured to the inertial sensor 14. As shown in FIG. 3, the inertial sensor 14 couples the different branches of the leadframe 22. FIG. 5 schematically shows the leadframe 22, bushings 20X, 20Y, and 20Z, and inertial sensor 14 after the web is removed.

After the web is removed, leads 27 may be formed for the interface port 18. To that end, the portion of the leadframe 22 forming the interface port 18 may be bent to accommodate some pre-specified requirement. In some embodiments, however, no processing is required because the two leadframe 22 branches forming the leads 27 already are in an appropriate form.

The entire assembly, referred to at this point in the process as an "intermediate assembly," then may be encapsulated by a encapsulating material, such as a hard plastic, thus completing the process (step 210). Before doing so, however, the inertial sensor 14 may be at least partially encapsulated with a resilient, elastomeric relief material (e.g., silicone or rubber). The relief material should enable the inertial sensor 14 to expand and contract during use and during molding. Alternatively, the intermediate assembly may be encapsulated in the elastomeric material as described and also in a harder material so that the resulting apparatus can be press fit into a housing, pin-staked, or otherwise attached without overmolding.

After it is at least partially encapsulated by the resilient material, the intermediate assembly may be encapsulated in a conventional manner, such as by standard injection molding processes. In some embodiments, the intermediate assembly is insert molded by an insert molding machine (not shown). To that end, a molten plastic encapsulates portions of the intermediate assembly within a mold cavity. After a pre-specified time, the molten plastic cures to form the interface port 18 and molded body 12 (see FIG. 1) of the satellite sensor 10. The entire intermediate assembly, however, is not fully encapsulated. Specifically, the bushings 20X, 20Y, and 20Z must be accessible and the leads 27 at the interface port 18 also should be accessible. Accordingly, the interface port 18 may be formed with a plastic shroud around the leads 27. The shroud can have clips to snap-fit with a complimentarily shaped wiring harness that leads to the noted computer or other logic device.

In alternative embodiments, the molding process encapsulates less of the intermediate assembly. For example, a portion of the inertial sensor 14 may remain exposed after the housing is formed.

The process shown in FIG. 2 thus forms a satellite sensor 10 having a sensor mount (with electrical interconnects and mounting bushings 20X, 20Y, and 20Z) and the bonded inertial sensor 14. It should be noted that the process may be executed in a different order than that discussed, and may omit some steps. Moreover, the process may benefit from additional steps. The process of FIG. 2 thus is intended to be an outline for a process of producing the satellite sensor 10. Those in the art understand that additional steps may be taken to enhance the process, such as testing the components at various stages of development.

The resulting satellite sensor 10 thus is smaller than those in the known prior art, and can be mounted in a plurality of different orientations. Accordingly, a single satellite sensor 10 has the capability of being mounted in a plurality of different orientations on a single mounting apparatus. Different satellite sensors for different orientations thus are not necessary (in many expected cases) because one satellite sensor has the diversity to be mounted in a plurality of different orientations. Moreover, due to its reduced profile, the satellite sensor 10 should be more readily mountable without requiring specially shaped areas in the automobile chassis for receiving the satellite sensor 10.

In contrast to the satellite sensor 10 of FIG. 1, other types of satellite sensors can only be mounted in one orientation. In such instances, a differently configured satellite sensor typically is required for each different orientation. For example, a first type of satellite sensor may be used for sensing along or about the X-axis, while another type of satellite sensor may be used for sensing along or about the Y-axis. As noted above, various embodiments of the invention combine a single one-dimensional inertial sensor 14 with a specially configured leadframe 22 to ultimately sense motion along one of two or more different axes (when mounted to a chassis).

Figure 6A:
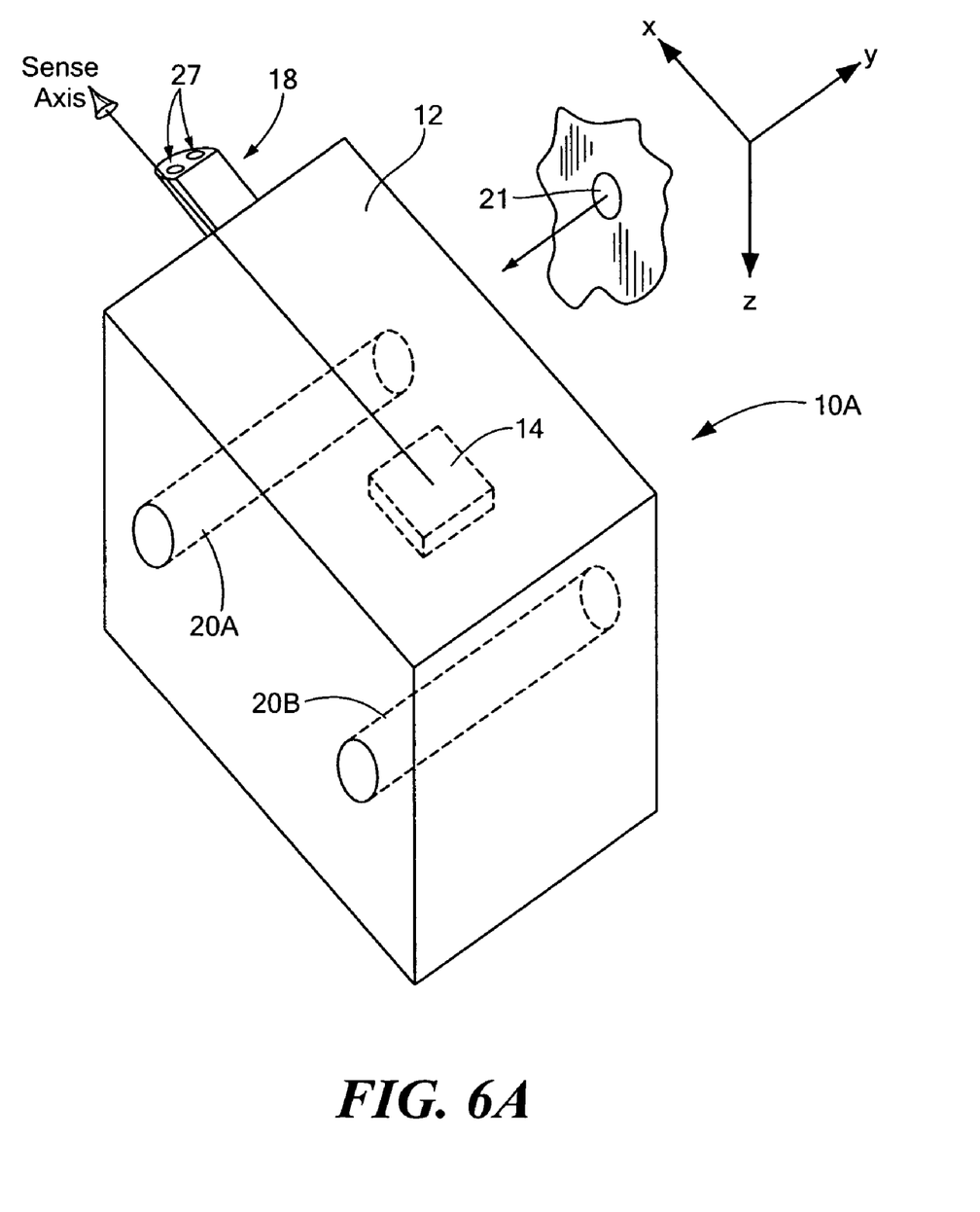
FIGS. 6A–6C schematically show three different satellite sensors configured in accordance with alternative embodiments of the invention.
Figure 6B:
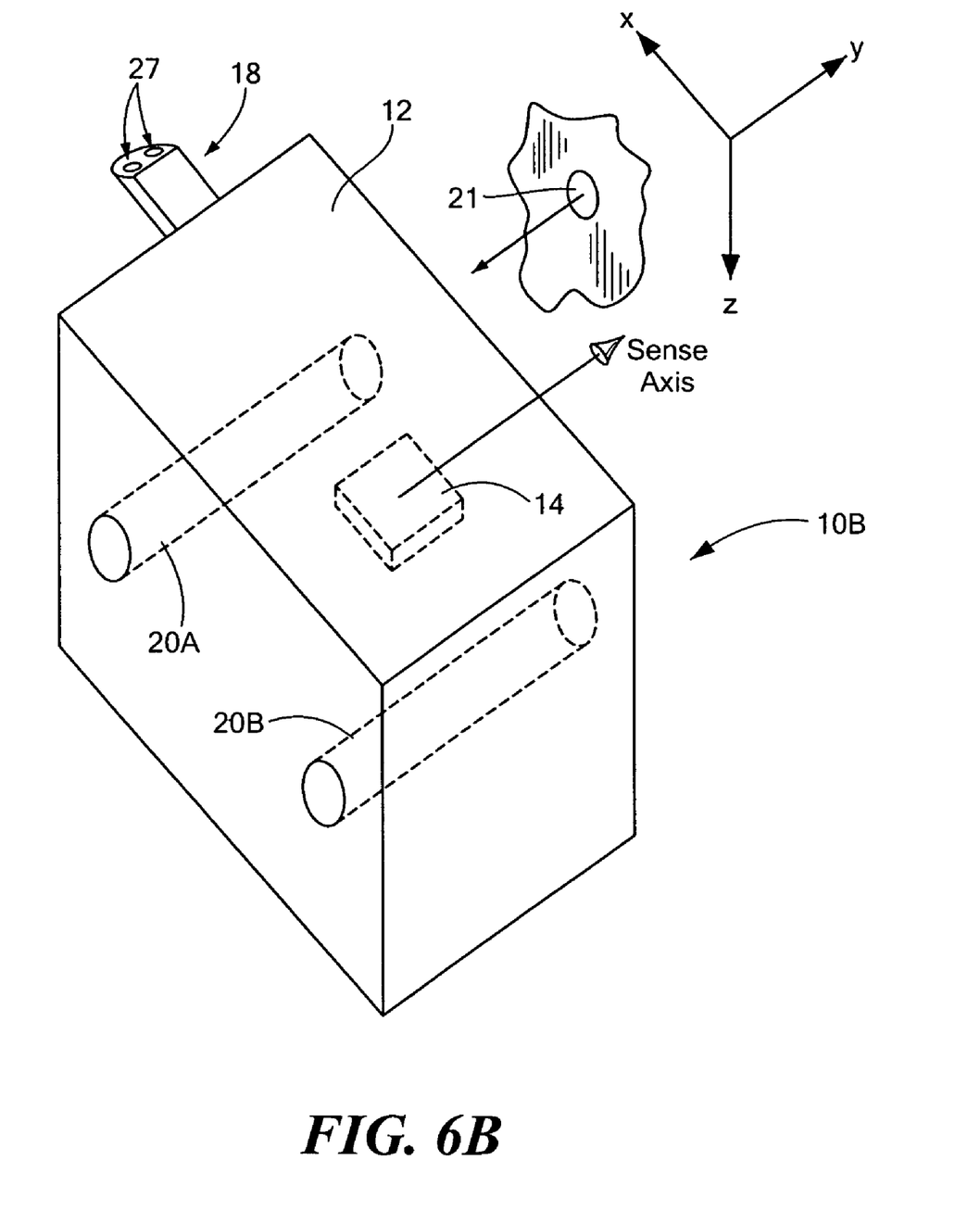
Figure 6C:
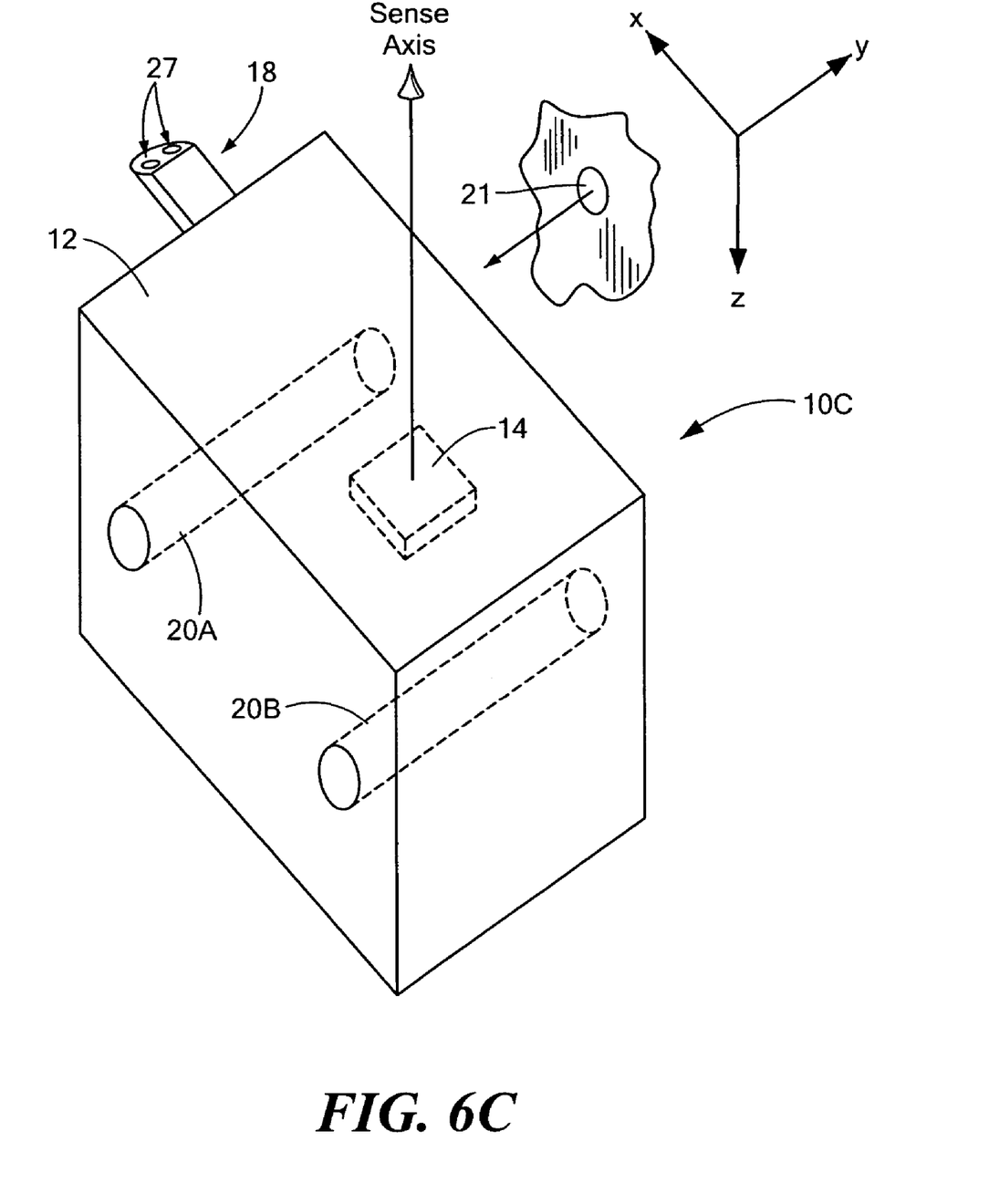

FIGS. 6A–6C schematically show three different satellite sensors 10A, 10B, and 10C that all have the same mounting system 16. In other words, unlike that shown in FIG. 1, the satellite sensors 10A, 10B, and 10C in FIGS. 6A–6C cannot be oriented in a plurality of different orientations—they can be oriented one way only (if only one mounting hole 21 is available). Accordingly, FIGS. 6A, 6B, and 6C respectively each show a satellite sensor 10A, 10B, and 10C configured to sense motion along or about the X-axis, Y-axis, and Z-axis. Like other drawings referred to herein, FIGS. 6A–6C are not necessarily drawn to scale.

In a manner similar to the satellite sensor 10 shown in FIG. 1, the satellite sensors 10A, 10B, and 10C shown in FIGS. 6A–6C each have the same injection molded body 12 containing an inertial sensor 14, and a mounting system 16 for mounting the sensor to a mounting apparatus in an underlying structure (e.g., an automobile chassis). The satellite sensors 10A, 10B, and 10C each also have an interface port 18 for communicating with external electronic devices (e.g., a computer system). The interface port 18 of each satellite sensor 10A, 10B, and 10C has both the mechanical coupling structure for coupling with a wiring harness, and one or more leads 27 to electrically communicate with an external electronic device.

As noted above, the satellite sensors 10A, 10B, and 10C shown in FIGS. 6A–6C also have identical mounting systems 16. Specifically, each mounting system 16 has a pair of substantially parallel spaced bushings 20A and 20B. A technician therefore can mount any of the satellite sensors 10A, 10B, and 10C by securing a bolt (or bolts) to a chassis mounting hole 21 (shown schematically in FIG. 6A and oriented to have a longitudinal axis that is substantially parallel with the Y-axis) through one or both bushings 20A and 20B. Consequently, there is no ambiguity as to which bushing 20A or 20B should be used because there is no flexibility as to which bushing 20A or 20B should be used to mount it to the chassis.

The technician nevertheless must select the appropriate satellite sensor 10A, 10B, or 10C to obtain the desired sensitivity. More specifically, the satellite sensors 10A, 10B, and 10C in FIGS. 6A–6C illustratively use the same type of one-dimensional inertial sensor 14. To produce three different types of satellite sensors 10A, 10B, and 10C, however, the orientation of the inertial sensor 14 is varied as a function of the desired axis of sensitivity. For example, the sense axis of the inertial sensor 14 of FIG. 6A is mounted on its underlying leadframe 22 to substantially align with the X-axis of the overall satellite sensor 10A. Accordingly, when mounted to the mounting hole 21 shown, the satellite sensor 10A in FIG. 6A is an X-axis satellite sensor. In a corresponding manner, the inertial sensors 14 in FIGS. 6B and 6C are respectively mounted to their leadframes 22 to align with the Y-axis and Z-axis of the satellite sensors 10B and 10C. Accordingly, after the appropriate satellite sensor 10A, 10B, or 10C is selected, the technician can unambiguously mount it to the mounting hole 21.

It should be noted that although various embodiments show the sensor 14 as being aligned with orthogonal X, Y, and Z axes, other embodiments can be aligned with any arbitrary axes, depending upon the intended use. Accordingly, discussion of the noted axes is exemplary and not intended to limit the scope of all embodiments.

Figure 7:
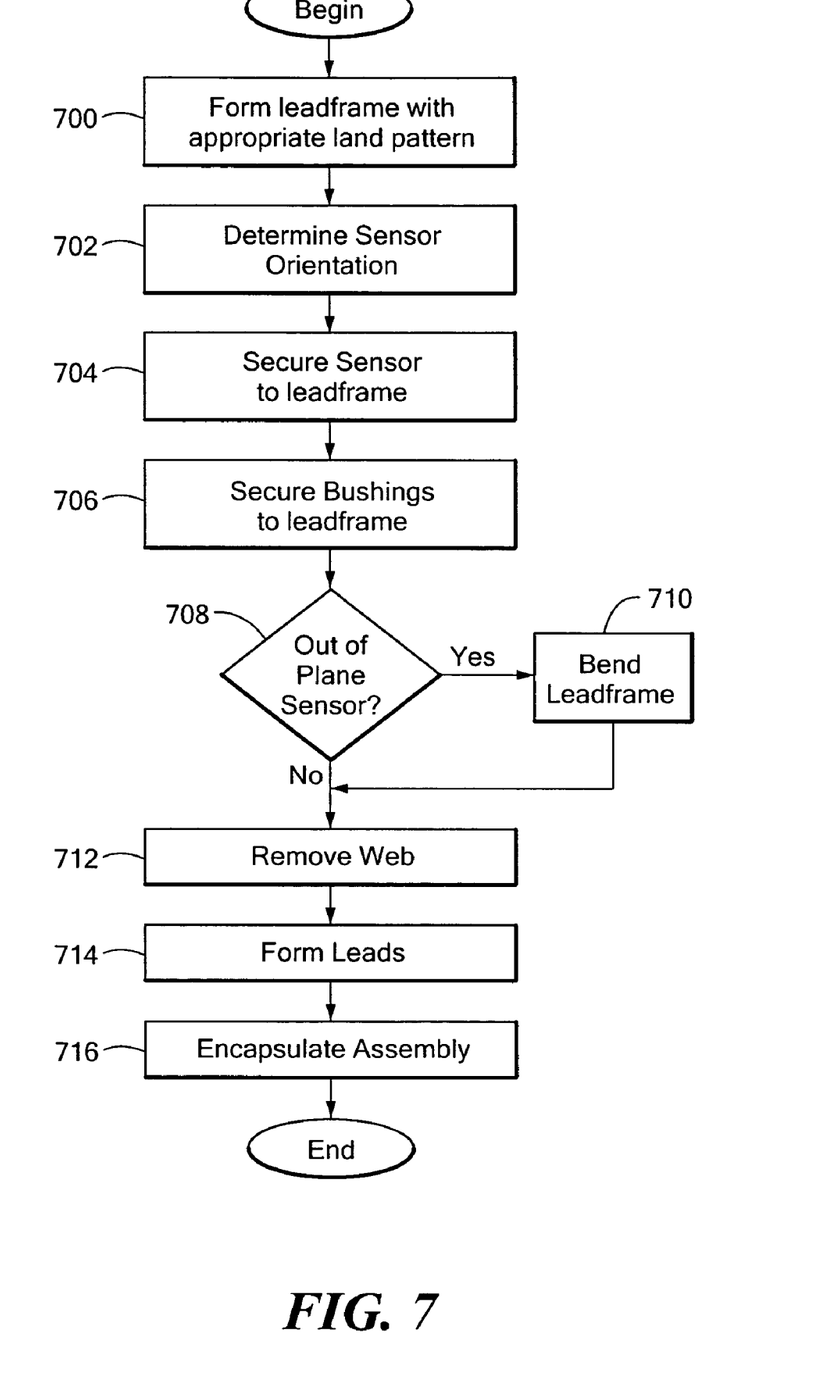
FIG. 7 shows an illustrative process of forming the satellite sensors shown in FIG. 6A–6C.

FIG. 7 shows an exemplary process of producing any one of the satellite sensors 10A, 10B, and 10C shown in FIGS. 6A–6C. The process begins at step 700, in which the leadframe 22 is at least partially formed. Specifically, in a manner similar to the leadframe 22 discussed with respect to FIG. 2, the leadframe 22 may be stamped from a flat sheet of a metal (e.g., copper or aluminum) to a shape that is consistent with the goals of illustrative embodiments. The sheet of metal may be stamped to form four branches that ultimately make up the leadframe 22. The four branches include two branches for transmitting sensor data and two other branches for the above noted bolt down logic.

Figure 8:
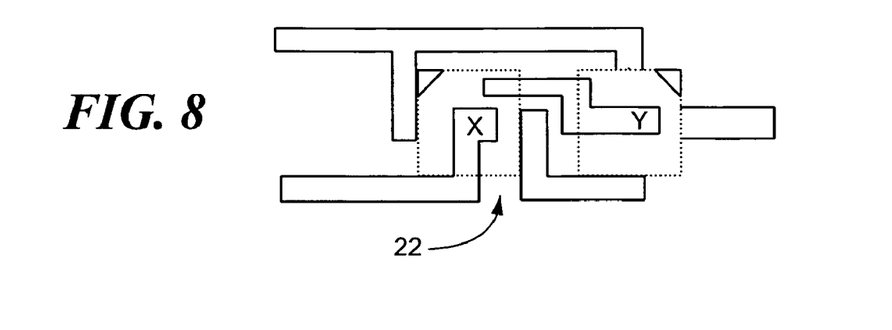
FIG. 8 schematically shows an exemplary land pattern formed by a leadframe within at least one of the satellite sensors shown in FIGS. 6A–6C.

Additionally, the stamping process illustratively forms a pre-specified land pattern (i.e., formed by a plurality of leadframe contacts) for receiving the inertial sensor 14. FIG. 8 schematically shows an exemplary land pattern for receiving the inertial sensor 14. Details of the sensor and its mounting orientation are discussed below.

The process then continues to step 702, in which the sensor orientation is determined. For example, to produce the X-axis satellite sensor 10A of FIG. 6A, the sense axis of the inertial sensor 14 should be oriented along the X-axis of the overall satellite sensor 10A. As noted above, the inertial sensor 14 illustratively has one axis of sensitivity only (i.e., it is a one-dimensional sensor). Of course, although unnecessary in various embodiments, the sensor may be a two dimensional inertial sensor. In a manner similar to the satellite sensor 10 in FIG. 1, the inertial sensor 14 illustratively is an accelerometer or a gyroscope.

After the orientation is determined, the inertial sensor 14 is secured to the leadframe 22 in the appropriate orientation (step 704). For example, the inertial sensor 14 in FIG. 6A is mounted to the leadframe 22 so that its sense axis aligns with the X-axis (of the satellite sensor 10), while the inertial sensor 14 of FIG. 6B is mounted to the leadframe 22 so that its sense axis aligns with the Y-axis. To those ends, the contacts 28 on the inertial sensor 14 (i.e., shown in FIGS. 4B–4D) should be mounted with the appropriate branches of the leadframe 22.

If the leadframe 22 has the land pattern of FIG. 8, then the inertial sensor 14 may be mounted in two different locations, depending upon the desired orientation. Specifically, to be oriented along or about the X-axis, the inertial sensor 14 is mounted so that its contacts 28 align with the leadframe land pattern shown in the location designated as box "X." Alternatively, to be oriented along or about the Y-axis, the inertial sensor 14 is mounted so that its contacts 28 align with the leadframe land pattern shown in the location designated as box "Y." These two orientations thus cause the inertial sensor 14 to align its sense axis in one of two substantially orthogonal directions.

In alternative embodiments, the land pattern of the leadframe 22 may permit the inertial sensor 14 to be mounted in two or more substantially orthogonal orientations at the same location. For example, a given leadframe 22 may mount the inertial sensor 14 in one orientation to sense movement along or about the X-axis. To sense motion along or about the Y-axis, however, the land pattern on the given leadframe 22 may mount the inertial sensor 14 in the same location, but rotated along its radial axis substantially ninety degrees from the X-axis orientation.

To produce the Z-axis satellite sensor 10C as shown in FIG. 6C, however, illustrative embodiments mount the inertial sensor 14 to a third location on the leadframe 22 (or a second location if the other two orientations use the same leadframe location). Of course, the third location has a land pattern that, when aligned with the contacts 28 on the inertial sensor 14, orients the sense axis along the Z-axis (of the satellite sensor 10). To that end, as discussed below, the third location is on a portion of the leadframe 22 that itself is substantially orthogonal to the above noted two locations (i.e., the locations that align the inertial sensor 14 with the X and Y axes). To produce this third location, the leadframe 22 may be bent, as discussed below. Production should be simpler, however, to make that bend at a later point in the process, which is discussed below.

In yet other embodiments, the leadframe 22 may be configured to accept the inertial sensor 14 in no more than two locations. Both such locations, however, may be orthogonal to each other. For example, such a leadframe 22 may be capable of orienting a one dimensional sensor along the Z-axis and the X-axis only.

The inertial sensor mounting processes discussed above with regard to FIG. 2 also may be used for this step. Specifically, conventional processes both electrically and mechanically connect the metallic contacts 28 on the inertial sensor 14 to the leadframe 22—no wire bonds are necessary. For example, reflow solder process (i.e., IR reflow), conductive adhesive, surface mounting, or localized laser reflow can be used to make that connection. Prior to soldering, the inertial sensor 14 may be tacked into position with a low tach adhesive. After soldering, the inertial component may be over-coated or potted for environmental protection.

After the inertial sensor 14 is secured to the leadframe 22, the process continues to step 706, in which the bushings 20A and 20B are secured to the leadframe 22. As noted above when discussing FIG. 2, the bushings 20A and 20B may be spot welded to provide the bolt down detect circuit path. Also as noted above with regard to FIG. 2, the bushings 20A and 20B may be split into two or more portions.

It then is determined at step 708 if the satellite sensor 10A, 10B, or 10C is an out-of-plane sensor. In other words, in the embodiment shown, it is determined if the satellite sensor 10A, 10B, or 10C is to have Z-axis sensitivity, such as that shown in FIG. 6C. If so, then the leadframe 22 is bent to cause the third location to be substantially orthogonal to the other two mounting locations. In alternative embodiments, the leadframe 22 is bent even if the satellite sensor 10A 10B, or 10C is not to have Z-axis sensitivity. Accordingly, such alternative embodiments omit step 708 and are considered to be produce a pre-formed leadframe 22 having the capability of orienting inertial sensors in one of three different directions.

Figure 9A:
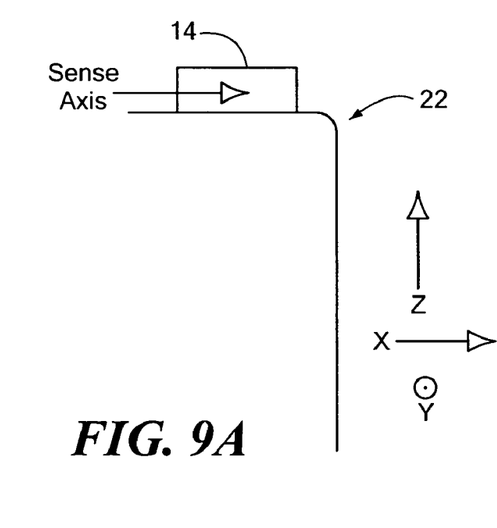
FIGS. 9A–9C schematically show a leadframe and various orientations that a sensor can be mounted to it, with FIG. 9A corresponding to the orientation in FIG. 6A, FIG. 9B corresponding to the orientation of FIG. 6B, and FIG. 9C corresponding to the orientation of FIG. 6C.
Figure 9B:
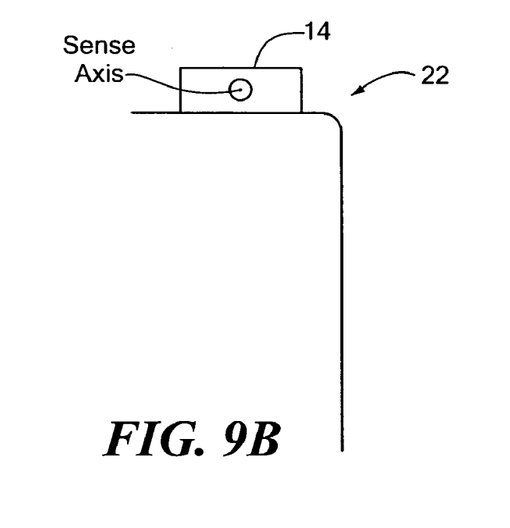
Figure 9C:
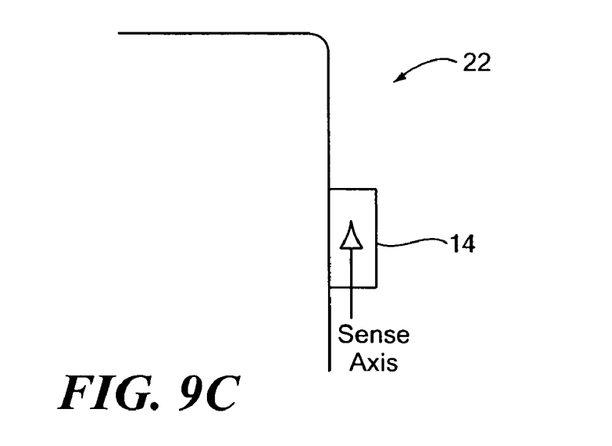

FIGS. 9A–9C schematically show side views of the leadframe 22 and inertial sensor 14. FIG. 9A corresponds to the orientation in FIG. 6A (along the X-axis), FIG. 9B corresponds to the orientation of FIG. 6B (along the Y-axis), and FIG. 9C corresponds to the orientation of FIG. 6C (along the Z-axis). As shown, the inertial sensor 14 in FIG. 9A is mounted so that its sense axis is substantially orthogonal to that shown in FIG. 9B. Notwithstanding this differing orientation, the inertial sensor 14 in both FIGS. 9A and 9B are mounted in the same plane.

In a similar manner, the inertial sensor 14 in FIG. 9C is mounted so that its sense axis is substantially orthogonal to those shown in FIGS. 9A and 9B. Moreover, the inertial sensor 14 in FIG. 9C also is mounted in a different plane than those in FIGS. 9A and 9B; namely, the inertial sensor 14 in FIG. 9C is mounted in a plane that is substantially orthogonal to those in FIGS. 9A and 9B. Consequently, the inertial sensor 14 may be oriented to sense motion along or about the Z-axis.

In alternative embodiments, the land pattern of the leadframe location used in FIG. 9C may accept the inertial sensor 14 in a manner that orients its sense axis along another axis, such as along the Y-axis. Moreover, those skilled in the art should understand that the ultimate orientation of the satellite sensor 10A, 10B, or 10C depends upon the orientation of the mounting hole(s) in the automobile chassis and the orientation of the bushings 20A and 20B. Accordingly, those components can be modified to change the orientation of the satellite sensor 10A, 10B, or 10C.

Returning to FIG. 7, after the leadframe 22 is bent, the process continues to step 712, in which the conventional processes remove the web. After the web is removed, leads 27 may be formed for the interface port 18 (step 714). To that end, the portion of the leadframe 22 forming the interface port 18 may be bent to accommodate some pre-specified requirement. In some embodiments, however, no processing is required because the two leadframe branches forming the leads 27 already are in an appropriate form.

Again, the entire assembly (also referred to at this point in the process as an "intermediate assembly") then may be encapsulated by a encapsulating material, such as a hard plastic, thus completing the process (step 716). Before doing so, however, the inertial sensor 14 may be at least partially encapsulated with a resilient, elastomeric relief material (e.g., silicone or rubber, noted above).

After it is at least partially encapsulated by the resilient material, the intermediate assembly may be encapsulated in a conventional manner, such as by standard injection molding processes (discussed above). After a pre-specified time, the molten plastic cures to form the interface port 18 and molded body 12 (see FIGS. 6A–6C) of the satellite sensor 10A, 10B, or 10C. The entire intermediate assembly, however, is not fully encapsulated. Specifically, at least one of the bushings 20A or 20B must be accessible and the leads 27 at the interface port 18 also should be accessible. The interface port 18 also may be formed with a plastic shroud around the leads 27. The shroud can have clips to snap-fit with a complimentarily shaped wiring harness that leads to the noted computer or other logic device.

In alternative embodiments, the molding process encapsulates less of the intermediate assembly. For example, a portion of the inertial sensor 14 may remain exposed after the housing is formed.

Although the above discussion discloses various exemplary embodiments of the invention, it should be apparent that those skilled in the art can make various modifications that will achieve some of the advantages of the invention without departing from the true scope of the invention.

What is claimed is:

1. A sensor mount for mounting a motion sensor to a single mount apparatus of an external object, the motion sensor being capable of detecting motion along or about a sensor axis, the sensor mount comprising:
   a mounting area for mounting the sensor; and
   a coupler system that is capable of coupling to the single mount apparatus of the external object in a manner that aligns the sensor axis with any one of a first axis, a second axis, or a third axis,
   the motion sensor being capable of detecting motion of the external object along or about the axis to which the sensor axis is aligned.

2. The sensor mount as defined by claim 1 further comprising circuitry for detecting the orientation of the sensor mount.

3. The sensor mount as defined by claim 1 wherein the coupler system includes a plurality of substantially orthogonal bushings that are capable of receiving a fastener.

4. The sensor mount as defined by claim 1 wherein the sensor is capable of detecting motion along or about one axis only.

5. The sensor mount as defined by claim 1 wherein the sensor is a MEMS device, the MEMS device being an accelerometer or a gyroscope.

6. The sensor mount as defined by claim 1 wherein, the first, second, and third axes are substantially orthogonal.

7. The sensor mount as defined by claim 1 wherein the sensor mount has a lead frame, the sensor being mounted to the leadframe to form an intermediate assembly, the intermediate assembly being at least partly encapsulated by an encapsulating material.

8. The sensor mount as defined by claim 1 further comprising the motion sensor mounted to the mounting area.

* * * * *

UNITED STATES PATENT AND TRADEMARK OFFICE
CERTIFICATE OF CORRECTION

PATENT NO. : 7,196,404 B2 Page 1 of 1
APPLICATION NO. : 10/849578
DATED : March 27, 2007
INVENTOR(S) : Mark L. Schirmer et al.

It is certified that error appears in the above-identified patent and that said Letters Patent is hereby corrected as shown below:

Col. 14, line 52
replace "claim 1 wherein, the first"
with --claim 1 wherein the first--.

Signed and Sealed this

Twenty-ninth Day of May, 2007

JON W. DUDAS
*Director of the United States Patent and Trademark Office*